United States Patent
Krüger et al.

(10) Patent No.: US 11,613,803 B2
(45) Date of Patent: Mar. 28, 2023

(54) USE OF A COMPONENT IN A COMPOSITION, COMPOSITION FOR LASER TRANSFER PRINTING, AND LASER TRANSFER PRINTING METHOD

(71) Applicant: LPKF Laser & Electronics AG, Garbsen (DE)

(72) Inventors: Robin Alexander Krüger, Hannover (DE); Malte Schulz-Ruhtenberg, Wunstorf (DE); Marc Hüske, Hannover (DE)

(73) Assignee: LPKF Laser & Electronics AG, Garbsen (DE)

( * ) Notice: Subject to any disclaimer, the term of this patent is extended or adjusted under 35 U.S.C. 154(b) by 0 days.

(21) Appl. No.: 17/092,894

(22) Filed: Nov. 9, 2020

(65) Prior Publication Data

US 2021/0189544 A1  Jun. 24, 2021

Related U.S. Application Data

(63) Continuation of application No. PCT/DE2019/100310, filed on Apr. 4, 2019.

(30) Foreign Application Priority Data

May 9, 2018 (DE) ................... 10 2018 111 132.0

(51) Int. Cl.

| | |
|---|---|
| *B41M 5/00* | (2006.01) |
| *B41M 5/24* | (2006.01) |
| *D06P 5/24* | (2006.01) |
| *C23C 14/04* | (2006.01) |
| *C23C 14/28* | (2006.01) |
| *B41M 5/382* | (2006.01) |

(52) U.S. Cl.
CPC .......... *C23C 14/048* (2013.01); *B41M 5/007* (2013.01); *B41M 5/0052* (2013.01); *C23C 14/28* (2013.01); *D06P 5/003* (2013.01); *B41M 5/24* (2013.01); *B41M 5/382* (2013.01); *B41M 2205/08* (2013.01)

(58) Field of Classification Search
CPC .... C23C 14/048; C23C 14/28; B41M 5/0052; B41M 5/007; B41M 5/24; B41M 5/382; B41M 2205/08; D06P 5/003
See application file for complete search history.

(56) References Cited

U.S. PATENT DOCUMENTS

| | | | |
|---|---|---|---|
| 6,805,918 B2 | 10/2004 | Auyeung et al. | |
| 2011/0151614 A1* | 6/2011 | Lochtman | H01L 31/022425 |
| | | | 257/E31.124 |
| 2012/0086761 A1* | 4/2012 | Chr Tien | C09D 11/104 |
| | | | 347/88 |
| 2012/0161081 A1 | 6/2012 | Kleine Jaeger et al. | |
| 2018/0122640 A1* | 5/2018 | Doll | H01L 21/2254 |

FOREIGN PATENT DOCUMENTS

| | | |
|---|---|---|
| DE | 69418056 T2 | 11/1999 |
| EP | 1268211 B1 | 1/2003 |
| EP | 1485255 B1 | 9/2003 |
| EP | 2155499 B1 | 12/2008 |
| EP | 2474004 B1 | 3/2011 |
| WO | WO 95/13195 | 5/1995 |

OTHER PUBLICATIONS

International Search Report in PCT/DE2019/100310, dated Aug. 20, 2019 (4 pages).

* cited by examiner

*Primary Examiner* — Yaovi M Ameh
(74) *Attorney, Agent, or Firm* — Fresh IP, PLC; Terrence L. B. Brown

(57) ABSTRACT

Use of a laser-activatable component in a composition and/or use of a composition that includes the laser-activatable component, during laser transfer printing, characterized in that the laser-activatable component is activated by laser irradiation during use in such a way that the viscosity and/or the elasticity and/or the tack of the composition increase(s) due to an increase in temperature of the composition, wherein the laser-activatable component is a polymer made up of the groups comprising polyethylene glycol, polyvinylpyrrolidone, polyvinyl acetate, polyvinyl alcohol, polyacrylate, polyester, or copolymers of these polymers or blends.

10 Claims, No Drawings

USE OF A COMPONENT IN A COMPOSITION, COMPOSITION FOR LASER TRANSFER PRINTING, AND LASER TRANSFER PRINTING METHOD

The invention relates to the use of a component in a composition, a composition for laser transfer printing, and a laser transfer printing method.

The fundamentals of so-called laser transfer printing are known from the prior art, in which a laser beam-transparent carrier that is situated opposite a substrate to be imprinted is coated with a printing substance, wherein a portion of the printing substance is evaporated by irradiating the coating, by means of laser beam energy, at a defined position on the carrier, and the unevaporated printing substance at the defined position on the carrier is accelerated by the evaporated printing substance, from the laser beam-transparent carrier toward the substrate, and the unevaporated portion of the printing substance deposits in part at a target location on the substrate in order to form a coating. With regard to the individual, precise details in relation to the basic method principles of the laser transfer printing method, reference is made in full to the disclosures of patent documents U.S. Pat. No. 6,805,918 B2, EP 2 474 004 B1, EP 2 155 499 B1, EP 1 268 211 B1, and EP 1 485 255 B1, so that in this regard the respective disclosures also represent part of the disclosure of the present patent application, and may thus be relied on in full.

A disadvantage of the laser transfer printing (LTP) methods known from the prior art, on the one hand, is that this method often shows a certain spatter tendency and/or spray mist formation during printing on the substrate. On the other hand, the distance between the carrier and the substrate is generally limited to 0.1-0.2 mm, since the pulse, required at fairly large distances, for detaching a drop results in bursting of the drop and a very irregular print image. However, fairly large distances are of major importance for an industrial implementation of the method.

The object of the present invention, therefore, is to provide uses, compositions, and associated laser transfer printing methods that at least partially minimize the above-mentioned disadvantages, so that a very clean print image is made possible at much greater distances between the carrier and the substrate.

This object is achieved according to the invention by a use according to the claims, by a composition according to the claims, and by a laser transfer printing method according to the claims.

The rheology (viscosity, elasticity, tack) of inks and pastes is an important manipulated variable for influencing the properties of inks and pastes. The interplay of viscosity, elasticity, and tack is generally optimized for the printing process used. However, the optimal rheological properties of the printing process usually do not align with the optimal rheological properties that are required for storing, pumping, or, for example, also after the printing process on the substrate. For this reason, inks and pastes generally involve a compromise that attempts to balance out these differing demands.

In laser transfer printing (LTP) it is also necessary to balance out this interplay of the differing optimal rheological properties. In this regard, the invention makes use of the fact that localized heating takes place due to the action of the laser, and components contained in the printing substance (in this context, also referred to as "composition" according to the invention) thus trigger a temporally and spatially limited change in the rheology of the printing substance. In the simplest case, this involves, for example, the melting of contained polymer particles. The melting causes, among other things, an increase in the viscosity of the printing substance, as the result of which the printing process has a lower spatter tendency, for example, and/or a greater printing distance is possible due to stabilization of the printing substance during the transfer. In principle, this could also be achieved by a generally constantly higher viscosity, but with the disadvantage that the pumping and application processes, for example, are thus made more difficult.

The term "transfer" refers to the overall process, beginning with the action of the laser radiation on the printing substance and ending as soon as the movement of the portion of the printing substance that is transferred onto the substrate is completed due to the kinetics and surface tension, and only changes due to the evaporation of solvents in the surrounding atmosphere still occur.

According to the invention, a component in a composition and/or a composition that includes a component are/is used, and the component is a laser-activatable component that is activated by laser irradiation during use in such a way that the viscosity and/or the elasticity and/or the tack of the composition increase(s) due to an increase in temperature of the composition.

It has surprisingly been found that in temperature-dependent viscosity measurements, up to a certain temperature the viscosity of the examined printing substances initially decreases during a temperature increase and then abruptly increases, contrary to the typical behavior of fluids. This surprising effect occurs around the melting range of added polymers or other additives. Further analysis has shown that in these particular compositions, the solubility of the added components was exceeded in some cases, and the component therefore was to some extent present undissolved at room temperature.

In practice, it has advantageously been found that the activation of the component results in an increase in the viscosity by at least 100 mPa·s, preferably by 500 mPa·s, particularly preferably by 1000 mPa·s.

In addition, it is advantageous when the activation of the component involves a phase transition, for example and in particular from solid to liquid, of the component in the composition.

Furthermore, it is advantageous when the activation of the component involves an increase in the solubility of the component in the composition.

It is particularly advantageous when this component is a meltable polymer.

As a result of the above-mentioned advantages, the ratio of the storage modulus of the composition to the loss modulus of the composition, and ultimately the gel character of the composition, increases due to the laser activation of the component.

In practice, it has proven advantageous when the laser-activatable component is a polymer made up of the groups comprising polyethylene glycol, polyvinylpyrrolidone, polyvinyl acetate, polyvinyl alcohol, polyacrylate, polyester, or copolymers of these polymers or blends.

In this context, it is advantageous when the molar weight of the polymer is selected in such a way that the polymer in the composition is not completely dissolved at the working temperature of the printing process.

In this context, it is particularly advantageous, based on the proven success, when a) polyethylene glycol having a molar mass ≥600 g/mol; and/or b) polyvinylpyrrolidone having a molar mass of 10,000 g/mol, for example; and/or c) polyvinyl acetate having a molar mass of 55,000-70,000 g/mol, for example; and/or d) polyvinyl alcohol having a molar mass of 31,000 g/mol, for example; and/or e) polyacrylate, for example the sodium salt of polyacrylic acid, having a molar mass of 5100 g/mol; and/or f) polyester, for example poly(D,L)lactide, having a molar mass of 10,000-18,000 g/mol are involved.

This list is by way of example and is not to be construed as exhaustive. Thus, for example, epoxides, polysaccharides, polyurethanes, poly(organo)siloxanes, formaldehyde condensates, (modified) natural resins, (modified) natural substances, waxes, and polyethers may act as laser-activatable components.

Lastly, in the overall context of the invention it is particularly advantageous when use for laser transfer printing is involved.

Also claimed is a composition for laser transfer printing, including a laser-activatable component as described above according to the invention.

It is particularly advantageous when the following substances are present in the weight quantities stated:

| | |
|---|---|
| Fillers (for example, Shepherd Black 30C941, Sigma-Aldrich silver powder, 2-3.5 µm) | 10-90 wt % |
| Solvents (for example, water, dipropylene glycol methyl ether) | 1-90 wt % |
| Laser-activatable component | 0.01-80 wt % |
| Glass frit (for example, Schott G018-255, G018-249) | 0-60 wt % |
| Organometallic compounds (silver oxalate, for example) | 0-10 wt % |
| Absorption agents for the laser radiation (Kremer Pigmente lamp black, for example) | 0-5 wt % |
| Additives (BYK-7420 ES, for example) | 0-5 wt % |
| Binder (for example, Kremer Pigmente gum arabic, casein) | 0-90 wt % |

Lastly, a laser transfer printing method is also claimed, wherein a laser-activatable component described according to the invention and/or an associated composition is used as the printing substance, in this context printing distances of ≥300 µm being possible.

In the method according to the invention, localized heating of the composition according to the invention takes place due to a corresponding laser pulse, so that a component thereof according to the invention locally and selectively melts and/or its solubility in the composition is increased, and in addition a portion of a solvent, for example and in particular water, alcohols, aliphatic and aromatic solvents, evaporates, so that a change in the viscosity and/or the elasticity and/or the tack also occurs, resulting in stabilization and/or firmer cohesion of the material of the composition according to the invention during the transfer, i.e., during the detachment from the carrier or the movement toward the substrate, and thus resulting in a better, more reproducible, and cleaner print image with fewer spatters and fewer so-called satellite drops, less spray mist formation, and a greater possible printing distance (up to 5 mm according to the invention).

During the transfer of the printing substance from the carrier to the substrate, the acting mechanical forces result in shearing of the printing substance. This shearing, in the same way as the temperature increase due to the laser radiation, results in a change in the rheological properties of the printing substance. This change may run counter to the effects of the temperature increase.

The temperature of the carrier may be adapted for further control of the composition properties, such as when the temperature of the carrier is lowered in order to increase the difference from the temperature and composition after the laser pulse, as the result of which the solubility of the component according to the invention is even further reduced.

As the result of dipole moment and polarizability properties of the individual components relative to one another with regard to the composition according to the invention, hydrogen bridge bonds and other associative interactions are used as a further means for adapting the composition properties, wherein the components according to the invention may participate actively and/or passively in such a hydrogen bridge network; the composition according to the invention generally has a gel-like character, at least during the transfer (i.e., the storage modulus of the composition is greater than the loss modulus of the composition).

The invention is explained in greater detail by the following embodiments in a non-restrictive manner.

EMBODIMENTS

Composition 1:

50 g polyethylene glycol 2000 (Carl Roth GmbH+Co. KG, molar mass: 1800-2200 g/mol) together with 400 g polyethylene glycol 400 (Carl Roth GmbH+Co. KG, molar mass: 380-420 g/mol) was heated to approximately 70° C. and stirred to form a clear solution. 550 g black pigment (The Shepherd Color Company, Black 1G) was slowly stirred in at this temperature. The still warm mixture was homogenized in a stepwise manner using a three roll mill (EXAKT Advanced Technologies GmbH, EXAKT 80E, Al2O3 roller material) temperature-controlled to 20° C., with progressively smaller gap sizes (beginning with 120 µm down to less than 5 µm). The paste thus obtained may be used directly for the LTP process, or stored for several weeks with exclusion of moisture.

Composition 2:

50 g polyethylene glycol 2000 (Carl Roth GmbH+Co. KG, molar mass: 1800-2200 g/mol) together with 300 g polyethylene glycol 400 (Carl Roth GmbH+Co. KG, molar mass: 380-420 g/mol) and 100 g ethylene glycol (Carl Roth GmbH+Co. KG) was heated to approximately 70° C. and stirred to form a clear solution. 550 g black pigment (The Shepherd Color Company, Black 1G) was slowly stirred in at this temperature. The still warm mixture was homogenized in a stepwise manner using a three roll mill (EXAKT Advanced Technologies GmbH, EXAKT 80E, Al2O3 roller material) that was temperature-controlled to 20° C., with progressively smaller gap sizes (beginning with 120 µm down to less than 5 µm). The paste thus obtained may be used directly for the LTP process, or stored for several weeks with exclusion of moisture.

Composition 3:

11.3 g polyethylene glycol 2000 (Carl Roth GmbH+Co. KG, molar mass: 1800-2200 g/mol) together with 25 g polyethylene glycol 400 (Carl Roth GmbH+Co. KG, molar mass: 380-420 g/mol) was heated to approximately 70° C. and stirred to form a clear solution. 0.14 g BYK 378 (BYK-Chemie GmbH) and 2.10 g BYK 7420 ES (BYK-Chemie GmbH) were added to this solution with stirring. 93.5 g silver particles (Sigma-Aldrich, particle size: 2-3.5 µm) and 19.3 g silver particles (Sigma-Aldrich, particle size: <100 nm, PVP-coated), 1.55 g carbon (Kremer Pigmente GmbH & Co. KG), and 1.5 g Bi₂O₃ (Carl Roth GmbH+Co. KG) were then slowly stirred in at this temperature. The still warm mixture was homogenized in a stepwise manner using a three roll mill (EXAKT Advanced Technologies GmbH, EXAKT 80E, Al2O3 roller material) that was temperature-controlled to 20° C., with progressively smaller gap sizes (beginning with 120 µm down to less than 10 µm). The paste thus obtained may be used directly for the LTP process, or stored for several weeks with exclusion of moisture.

Transfer process 1:

A fiber laser that emits at a wavelength of 1070 nm was used for the laser transfer printing. A polyimide film was used as the carrier, and glass was used as the substrate. A printing distance of 500 µm between the carrier and the substrate was selected. The coating of the printing substance on the carrier had a thickness of 30 µm. The beam source was operated in continuous wave mode with an average power of 150 W.

Transfer process 2:

A fiber laser that emits at a wavelength of 1070 nm was used for the laser transfer printing. Glass was used as the carrier and as the substrate. A printing distance of 1 mm between the carrier and the substrate was selected. The coating of the printing substance on the carrier had a thickness of 50 µm. The beam source was operated in a pulsed manner with a pulse duration of approximately 1 µs. The average power was 20 W with a pulse repetition rate of 100 kHz.

The invention claimed is:

1. Use of a laser-activatable component in a composition and/or use of a composition that includes the laser-activatable component, during laser transfer printing, wherein:
    a) the laser-activatable component is activated by laser irradiation during use in such a way that viscosity and/or elasticity and/or tack of the composition increase(s) due to an increase in temperature of the composition, wherein the laser-activatable component is a polymer made up of the groups comprising polyethylene glycol, polyvinylpyrrolidone, polyvinyl acetate, polyvinyl alcohol, polyacrylate, polyester, or copolymers of these polymers or blends;
    b) activation of the component results in an increase in the viscosity by at least 100 mPa·s;
    c) the polyethylene glycol having a molar mass ≥600 g/mol;
    d) the polyvinylpyrrolidone having a molar mass of 10,000 g/mol;
    e) the polyvinyl acetate having a molar mass of 55,000-70,000 g/mol;
    f) the polyvinyl alcohol having a molar mass of 31,000 g/mol;
    g) the polyacrylate, as the sodium salt of polyacrylic acid, having a molar mass of 5100 g/mol; and
    h) the polyester, namely poly(D,L)lactide, having a molar mass of 10,000-18,000 g/mol are involved.

2. The use according to claim 1,
    a) the increase in the viscosity is up to 500 mPa·s or up to 1000 mPa·s.

3. The use according to claim 1, wherein:
    a) the activation of the component involves a phase transition of the component in the composition.

4. The use according to claim 1, wherein:
    a) the activation of the component involves an increase in the solubility of the component in the composition.

5. The use according to claim 1, wherein:
    a) the component is a meltable polymer.

6. The use according to claim 1, wherein:
    a) the ratio of the storage modulus of the composition to the loss modulus of the composition increases due to the laser activation of the component.

7. The use according to claim 5, wherein:
    a) the molar weight of the polymer is selected in such a way that the polymer in the composition is not completely dissolved at the working temperature of the printing process.

8. A composition for laser transfer printing that includes the laser-activatable component according to claim 1.

9. The composition according to claim 8, wherein:
    a) the composition contains the following substances in the weight quantities stated:

| | |
|---|---|
| Fillers | 10-90 wt % |
| Solvents | 1-90 wt % |
| Laser-activatable component | 0.01-80 wt % |
| Glass frit | 0-60 wt % |
| Organometallic compounds | 0-10 wt % |
| Absorption agents for the laser radiation | 0-5 wt % |
| Additives | 0-5 wt % |
| Binder | 0-90 wt %. |

10. A laser transfer printing method, wherein: a laser-activatable component according to claim 1 and/or a composition according to claim 8 are/is used as the printing substance.

* * * * *